US009560769B2

(12) United States Patent
Shimabe et al.

(10) Patent No.: US 9,560,769 B2
(45) Date of Patent: Jan. 31, 2017

(54) PRINTED WIRING BOARD

(71) Applicant: IBIDEN CO., LTD., Ogaki-shi (JP)

(72) Inventors: Toyotaka Shimabe, Ogaki (JP); Ryuichiro Tominaga, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 49 days.

(21) Appl. No.: 14/713,063

(22) Filed: May 15, 2015

(65) Prior Publication Data

US 2015/0334844 A1 Nov. 19, 2015

(30) Foreign Application Priority Data

May 15, 2014 (JP) ................................ 2014-101545

(51) Int. Cl.
| | |
|---|---|
| *H05K 1/18* | (2006.01) |
| *H05K 3/46* | (2006.01) |
| *H05K 1/03* | (2006.01) |
| *H05K 1/11* | (2006.01) |

(52) U.S. Cl.
CPC .............. *H05K 1/185* (2013.01); *H05K 1/032* (2013.01); *H05K 1/115* (2013.01); *H05K 3/4602* (2013.01); *H05K 2201/09045* (2013.01); *H05K 2201/09854* (2013.01); *H05K 2201/10015* (2013.01);
(Continued)

(58) Field of Classification Search
CPC ........ H05K 1/185; H05K 1/115; H05K 1/032; H05K 3/4602
See application file for complete search history.

(56) References Cited

U.S. PATENT DOCUMENTS

| | | | | |
|---|---|---|---|---|
| 8,735,739 B2 * | 5/2014 | Ishihara | ............... | H05K 3/4691 174/255 |
| 9,027,238 B2 * | 5/2015 | Ito | ....................... | H01L 23/5385 174/255 |
| 9,232,656 B2 * | 1/2016 | Mikado | .................. | H05K 1/185 |

(Continued)

FOREIGN PATENT DOCUMENTS

JP 2013-183029 A 9/2013

OTHER PUBLICATIONS

U.S. Appl. No. 14/713,064, filed May 15, 2015, Shimabe, et al.
U.S. Appl. No. 14/663,573, filed Mar. 20, 2015, Shimabe, et al.

*Primary Examiner* — Jeremy C Norris
*Assistant Examiner* — Nathan Milakovich
(74) *Attorney, Agent, or Firm* — Oblon, McClelland, Maier & Neustadt, L.L.P.

(57) ABSTRACT

A printed wiring board includes a substrate having first and second cavities, first electronic components accommodated in the first cavity, second electronic components accommodated in the second cavity, and a build-up layer formed on the substrate and including an insulating interlayer such that the interlayer is covering the first and second cavities. The substrate has a first projection structure partitioning the first components in the first cavity and a second projection structure partitioning the second components in the second cavity, and the first and second cavities and the first and second projection structures are formed in the substrate such that T1<T2 and W1<W2 are satisfied where T1 represents distance between the first components, T2 represents distance between the second components, W1 represents width of edge of the first structure in the first cavity, W2 represents width of edge of the second structure in the second cavity.

20 Claims, 12 Drawing Sheets

(52) U.S. Cl.
CPC .............. *H05K 2201/10636* (2013.01); *H05K 2203/1469* (2013.01)

(56) References Cited

U.S. PATENT DOCUMENTS

| | | | |
|---|---|---|---|
| 9,282,635 B2* | 3/2016 | Shimabe | H05K 1/0284 |
| 9,433,097 B2* | 8/2016 | Tomikawa | H05K 1/183 |
| 2004/0228096 A1* | 11/2004 | Mueller | H01L 23/3677 |
| | | | 361/709 |
| 2010/0018761 A1* | 1/2010 | Wang | H01L 23/5389 |
| | | | 174/260 |
| 2011/0290408 A1* | 12/2011 | Samejima | H05K 3/445 |
| | | | 156/182 |
| 2014/0124255 A1* | 5/2014 | Kim | H05K 3/429 |
| | | | 174/260 |
| 2014/0144686 A1* | 5/2014 | Shimizu | H05K 1/185 |
| | | | 174/258 |
| 2014/0151104 A1* | 6/2014 | Chung | H05K 1/186 |
| | | | 174/260 |
| 2014/0202741 A1* | 7/2014 | Okamoto | H05K 1/0206 |
| | | | 174/252 |
| 2014/0216794 A1* | 8/2014 | Hibino | H05K 3/429 |
| | | | 174/255 |
| 2014/0353006 A1* | 12/2014 | Lee | H05K 1/186 |
| | | | 174/251 |
| 2016/0007468 A1* | 1/2016 | Tomikawa | H05K 1/0204 |
| | | | 174/260 |

\* cited by examiner

PRINTED WIRING BOARD

CROSS-REFERENCE TO RELATED APPLICATIONS

The present application is based upon and claims the benefit of priority to Japanese Patent Application No. 2014-101545, filed May 15, 2014, the entire contents of which are incorporated herein by reference.

BACKGROUND OF THE INVENTION

Field of the Invention

The present invention relates to a printed wiring board with a built-in electronic component.

Description of Background Art

Japanese Patent Laid-Open Publication No. 2013-183029 describes a printed wiring board in which chip capacitors are built in a core substrate. The entire contents of this publication are incorporated herein by reference.

SUMMARY OF THE INVENTION

According to one aspect of the present invention, a printed wiring board includes a core substrate having a first cavity and a second cavity, first electronic components accommodated in the first cavity of the core substrate, second electronic components accommodated in the second cavity of the core substrate, and a build-up layer formed on the core substrate and including an insulating resin interlayer such that the insulating resin interlayer is covering the first cavity and the second cavity. The core substrate has a first projection structure partitioning the first electronic components in the first cavity and a second projection structure partitioning the second electronic components in the second cavity, and the first and second cavities and the first and second projection structures are formed in the core substrate such that $T1<T2$ and $W1<W2$ are satisfied where $T1$ represents a distance between the first electronic components, $T2$ represents a distance between the second electronic components, $W1$ represents a width of an edge of the first projection structure in the first cavity, and $W2$ represents a width of an edge of the second projection structure in the second cavity.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
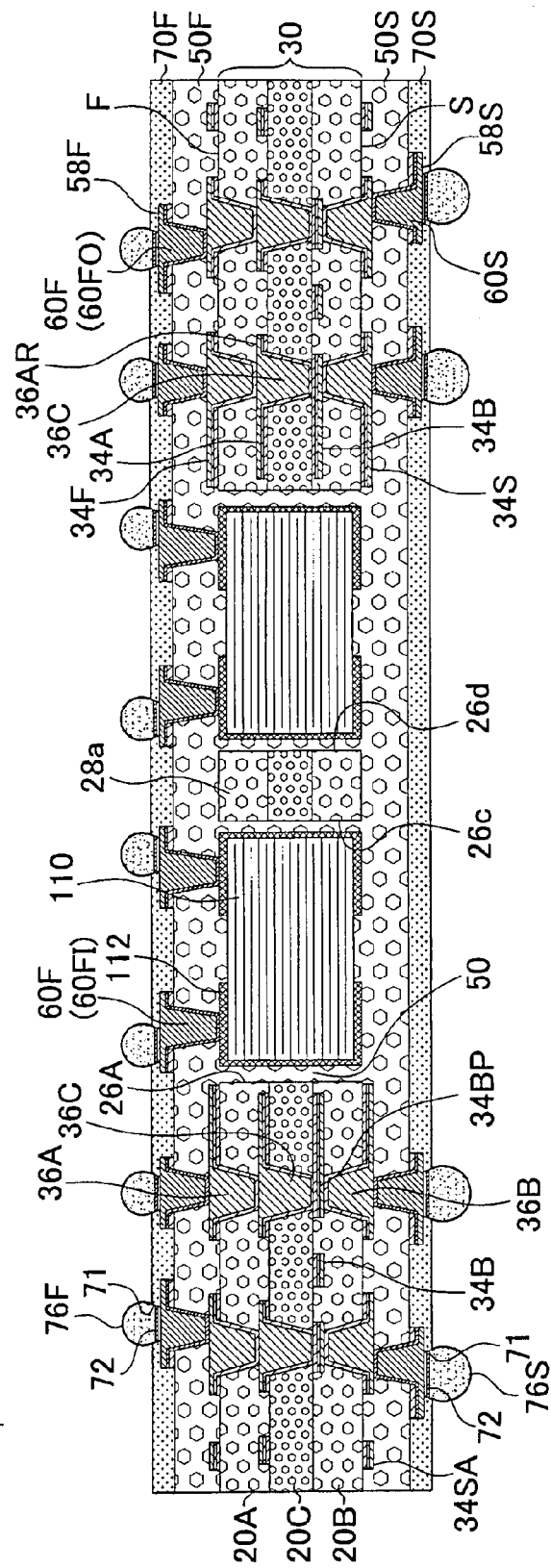
FIG. 1 is a cross-sectional view of a printed wiring board according to a first embodiment of the present invention.

The embodiments will now be described with reference to the accompanying drawings, wherein like reference numerals designate corresponding or identical elements throughout the various drawings.

First Embodiment

A cross section of a printed wiring board 10 according to a first embodiment of the present invention is illustrated in FIG. 1. In the printed wiring board 10, an electronic component 110 such as a chip capacitor is built in a multilayer core substrate 30 that has a first surface (F) and a second surface (S) that is on an opposite side of the first surface. Here, the electronic component is not limited to a chip capacitor, but may also be a chip resistor, an inductor or a thermistor.

The multilayer core substrate 30 of the printed wiring board of the first embodiment has a third resin layer (20C), and has a first resin layer (20A) and a second resin layer (20B) that sandwich the third resin layer. The first resin layer is an uppermost layer of the core substrate, and the second resin layer is a lowermost layer of the core substrate. The first surface (F) of the core substrate and a first surface of the resin layers are the same surface; and the second surface (S) of the core substrate and a second surface of the resin layers are the same surface. The resin layers (20C, 20A, 20B) each have a reinforcing material.

The core substrate has a first conductor layer (34F) on the first surface of the first resin layer, a second conductor layer (34S) on the second surface of the second resin layer, a third conductor layer (34A) between the first resin layer and the third resin layer, and a fourth conductor layer (34B) between the second resin layer and the third resin layer. The first, second and third conductor layers each include a via land. The fourth conductor layer includes a via pad (34BP) (pad of a via conductor). The first, second, third and fourth conductor layers each may further include a conductor circuit.

The core substrate further has an interlayer connection conductor (via conductor) (36A) that penetrates through the first resin layer and connects the first conductor layer and the third conductor layer, an interlayer connection conductor (via conductor) (36B) that penetrates through the second resin layer and connects the second conductor layer and the fourth conductor layer, and an interlayer connection conductor (via conductor) (36C) that penetrates through the third resin layer and connects the third conductor layer and the fourth conductor layer.

The via conductors (36A, 36B, 36C) are linearly laminated. A through-hole conductor is formed by these via conductors and the via pad (34BP) that is sandwiched by the via conductor (36B) and the via conductor (36C). The via conductor (36A) is directly laminated on the via conductor (36C). The via conductor (36C) and the via conductor (36B) sandwich the via pad (34BP). When the thicknesses of the resin layers are substantially the same, the via conductors of the resin layers have equal lengths. Reliability of the through-hole conductor is increased.

Figure 2:
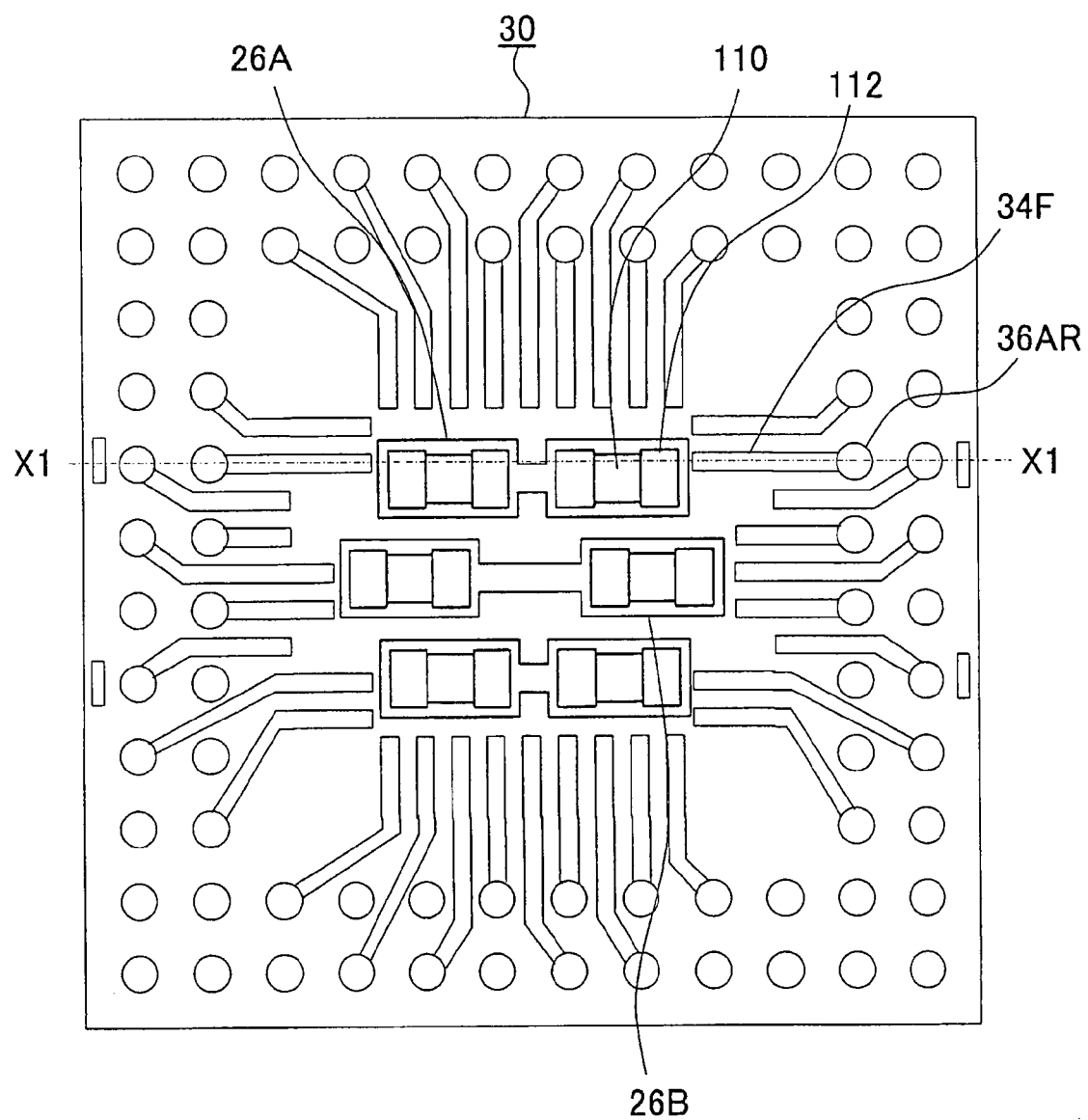
FIG. 2 is a plan view of a multilayer core substrate of the printed wiring board according to the first embodiment.

FIG. 2 is a plan view of the multilayer core substrate 30 in FIG. 1. An X1-X1 cross section in FIG. 2 corresponds to FIG. 1. The core substrate has a first cavity (26A) and a second cavity (26B) that extend from the first surface (F) to the second surface (S). The first cavity (26A) is formed to have a width narrower than that of the second cavity (26B). The first cavity (26A) and the second cavity (26B) penetrate through the resin layers that form the core substrate. A pair of electronic components 110 is accommodated in each of the first cavity (26A) and the second cavity (26B). On the multilayer core substrate, a land (36AR) of the via conductor (36A) described above with reference to FIG. 1 and the first conductor layer (34F) are formed.

Figure 3A:
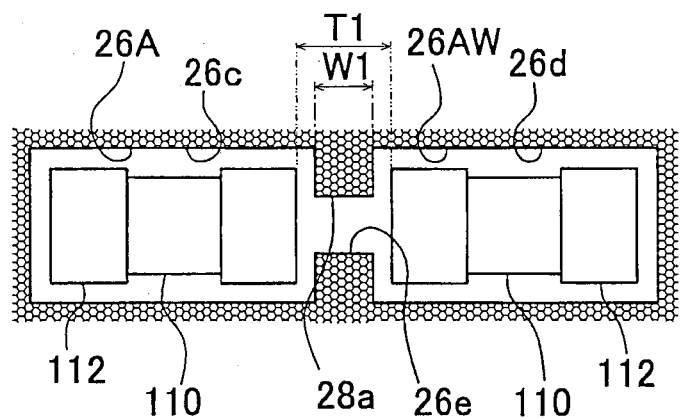
FIG. 3A illustrates a first cavity.
Figure 3B:
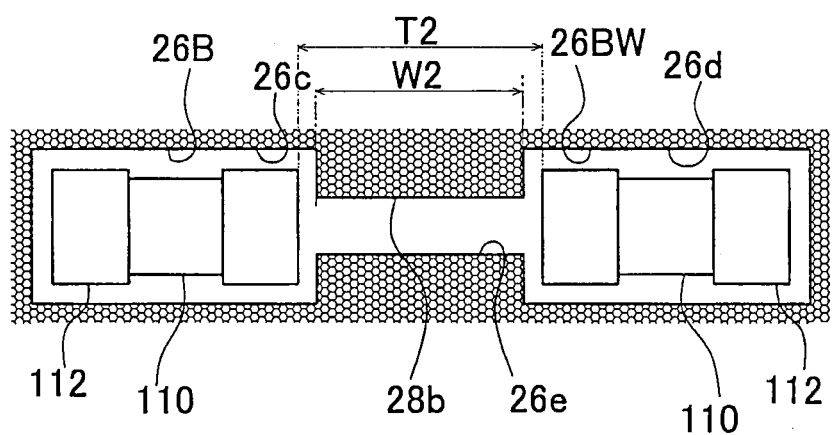
FIG. 3B illustrates a second cavity.

The first cavity (26A) in FIG. 2 is illustrated in FIG. 3A and the second cavity (26B) is illustrated in FIG. 3B.

The first cavity (26A) includes rectangular space part (26c) and space part (26d) for accommodating the electronic components and rectangular first projections (28a) for partitioning between the electronic components in the space parts. The first projections (28a) project from a side wall (26AW) of the first cavity in directions parallel to the first surface and the second surface of the multilayer core substrate and are formed as a pair of opposing first projections. Between the first projection (28a) and the first projection (28a), a communicating part (26e) connecting the space part (26c) and the space part (26d) is formed. As illustrated in FIG. 1, via conductors (60FI) are connected to terminals 112 of the electronic components 110 accommodated in the space parts (26c, 26d).

The second cavity (26B) includes rectangular space part (26c) and space part (26d) for accommodating the electronic components and rectangular second projections (28b) for partitioning between the electronic components in the space parts. The second projections (28b) project from a side wall (26BW) of the second cavity in directions parallel to the first surface and the second surface of the multilayer core substrate and are formed as a pair of opposing second projections. Between the second projection (28b) and the second projection (28b), a communicating part (26e) connecting the space part (26c) and the space part (26d) is formed.

In the first embodiment, the space parts (26c, 26d) that accommodate the electronic components and the first projections (28a) and second projections (28b) that partition between the electronic components are formed in the coexisting first cavity (26A) and second cavity (26B), the first cavity (26A) having a relatively small width and the second cavity (26B) having a relatively large width. A distance (T1) between the electronic components in the first cavity, a width (W1) of the first projections (28a), a distance (T2) between the electronic components in the second cavity and a width (W2) of the second projections (28b) satisfy T1<T2 and W1<W2.

The projections (28a) that have a small width are provided in the first cavity (26A) that has a small width and the projections (28b) that have a large width are provided in the second cavity (26B) that has a large width. Therefore, the electronic components 110 can be respectively properly positioned by the coexisting first and second cavities, the first cavity having a small width and the second cavity having a large width. The via conductors (60FI) can be reliably connected to the terminals 112 of the electronic components 110. Further, even when the cavities having different widths coexist, it does not cause a contact failure or the like to occur between the electronic components. Therefore, flexibility in designing the sizes of the cavities is increased. In the present embodiment, two electronic components are accommodated in each of the first cavity (26A) and the second cavity (26B). Therefore, as compared to a case where two cavities each accommodating one electronic component are arranged side by side, a dead space for wiring is reduced and wiring arrangement is facilitated.

By using the resin layers to form the core substrate, the resin layers each have a thin thickness. Therefore, the openings for the via conductors that are formed in the respective resin layers can be easily filled by plating. Via conductors containing fewer defects such as voids or containing no defects are formed. Therefore, the through-hole conductor has a lower resistance. However, the core substrate is not limited to a multilayer core substrate, but may also be a two-layer core substrate in which a conductor layer is formed on both sides of a resin layer.

The core substrate of the first embodiment has the cavities (26A, 26B) for accommodating the electronic components. Therefore, the core substrate has a low strength. However, in the first embodiment, the through-hole conductor is formed by filled vias and a via pad that is made of metal. Therefore, the core substrate has a high strength. Therefore, even when the core substrate has the cavity for accommodating an electronic component, warpage of the printed wiring board is small. The electronic component that is built in the core substrate is unlikely to be damaged. Even when the resin layers are each thin, the strength of the core substrate is increased by the through-hole conductor. Therefore, a thin electronic component can be built in the core substrate. A thickness of the core substrate is equal to or greater than a thickness of the electronic component. It is preferable that a difference between the thickness of the core substrate and the thickness of the electronic component is in a range from 0 to 220 μm.

As illustrated in FIG. 1, an upper side build-up layer is formed on the first surface (F) of the multilayer core substrate 30 and on the chip capacitor. The upper side build-up layer includes an insulating layer (first interlayer resin insulating layer) (50F) that is formed on the first surface (F) of the multilayer core substrate 30 and on the chip capacitor 110, a conductor layer (upper side conductor layer) (58F) on the insulating layer (50F), and a via conductor (60F) that penetrates through the insulating layer (50F) and connect the first conductor layer (34F) or the through-hole conductor and the conductor layer (58F). The via conductor (60F) includes a via conductor (60FI) that connects the conductor layer (58F) and an electrode 112 of an electronic component such as a chip capacitor.

A lower side build-up layer is formed on the second surface (S) of the multilayer core substrate 30 and below the chip capacitor. The lower side build-up layer includes an insulating layer (second interlayer resin insulating layer) (50S) that is formed on the second surface (S) of the multilayer core substrate 30 and below the chip capacitor, a conductor layer (lower side conductor layer) (58S) below the insulating layer (50S), and a via conductor (60S) that penetrates through the insulating layer (50S) and connects the second conductor layer (34S) or the through-hole conductor and the conductor layer (58S). The second conductor layer (34S) includes an alignment mark (34SA). Spacings in the cavities (26A, 26B) for accommodating the electronic components are filled with a filler 50. The spacings are spaces between the electronic component and the core substrate. The spacings are filled with a resin component of the interlayer resin insulating layer. However, the upper and lower side build-up layers may each include interlayer resin insulating layers and conductor layers.

Solder resist layers (70F, 70S) having openings 71 are formed on the upper side and lower side build-up layers. Upper surfaces of the conductor layers (58F, 58S) and the via conductors (60F, 60S) that are exposed by the openings 71 of the solder resist layers function as pads. Metal films 72 such as Ni/Pd/Au are formed on the pads, and solder bumps (76F, 76S) are formed on the metal films. An IC chip is mounted on the printed wiring board 10 via the solder bump (76F) that is formed on the upper side build-up layer. The printed wiring board is mounted on a motherboard via the solder bump (76S) that is formed on the lower side build-up layer.

In the first embodiment, the chip capacitor 110 is built in the multilayer core substrate 30. Therefore, a distance between the chip capacitor 110 and the mounted IC chip is short. Therefore, power is instantaneously supplied to the IC chip and thus the IC chip is unlikely to malfunction.

Manufacturing Method of First Embodiment

A method for manufacturing the printed wiring board 10 of the first embodiment is illustrated in FIG. 4A-9B.

Figure 4A:
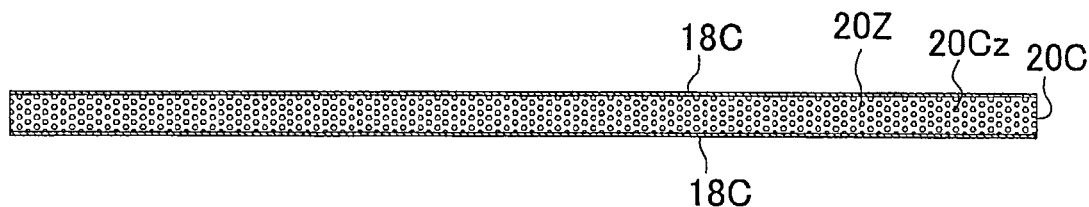
FIGS. 4A-4E are process diagrams illustrating a method for manufacturing the printed wiring board of the first embodiment.

(1) A double-sided copper-clad laminated plate (20Z), which is formed from an insulating base material (20Cz) having a first surface (F) and a second surface on the opposite side of the first surface (F) and a copper foil (18C) laminated on both sides of the insulating base material (20Cz), is a starting material The insulating base material has a thickness of 45-75 µm. When the thickness is less than 45 µm, the strength of the substrate is too low. When the thickness exceeds 75 µm, the printed wiring board becomes thick. A surface of the copper foil (18C) is subjected to a blackening treatment (not illustrated in the drawings) (FIG. 4A). The insulating base material includes a glass cloth. The glass is a T glass. The insulating base material (20Cz) corresponds to the third resin layer (20C).

Figure 4B:
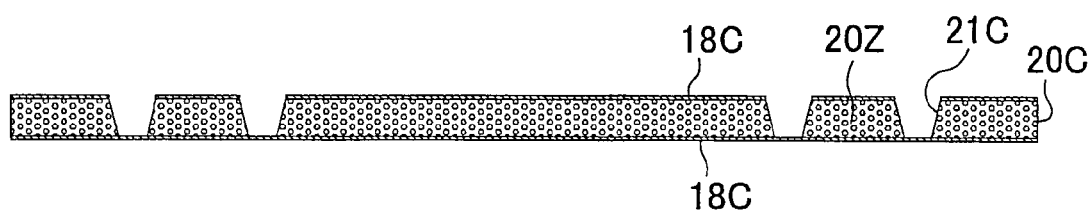

(2) Laser is irradiated to the double-sided copper-clad laminated plate (20Z) from the first surface (F) side of the insulating base material. An opening (21C) for a via conductor is formed in the insulating base material (FIG. 4B).

Figure 4C:
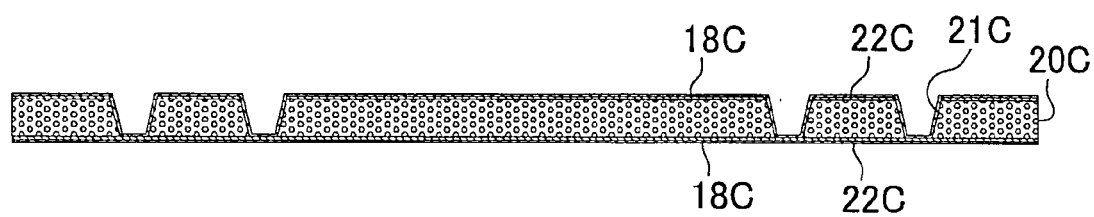

(3) By an electroless plating treatment, an electroless plating film (22C) is formed on an inner wall of the opening (21C) and on the copper foil (FIG. 4C).

Figure 4D:
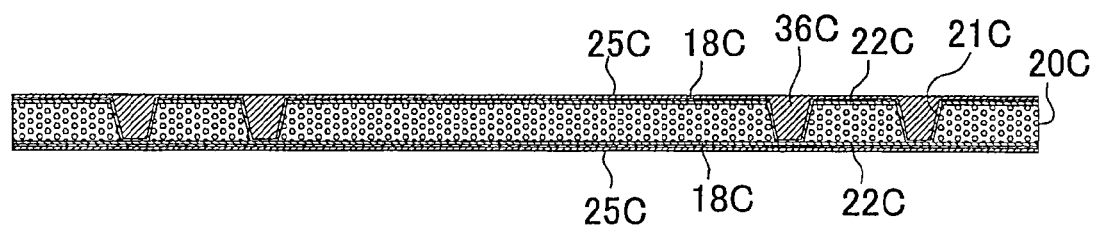

(4) By an electrolytic plating treatment, an electrolytic plating film (25C) is formed on the electroless plating film. The opening (21C) is filled by the electrolytic plating film and the via conductor (36C) is formed. The via conductor (36C) is formed by the electroless plating film (22C) that is formed on the inner wall of the opening (21C) and the electrolytic plating film (25C) that fills the opening (21C) (FIG. 4D).

Figure 4E:
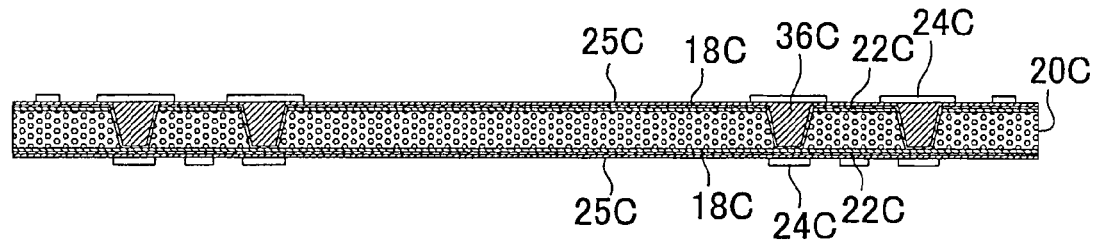

(5) An etching resist (24C) of a predetermined pattern is formed on the electrolytic plating film (26C) (FIG. 4E).

Figure 5A:
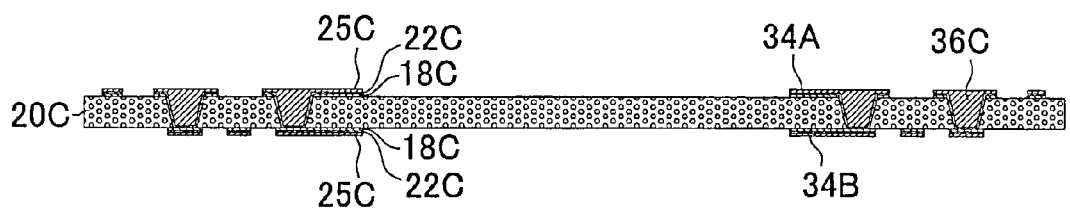
FIGS. 5A-5D are process diagrams illustrating the method for manufacturing the printed wiring board of the first embodiment.

(6) The electrolytic plating film (22C), the electroless plating film (25C) and the copper foil (18C) that are exposed from the etching resist are removed. Thereafter, the etching resist is removed. The third conductor layer (34A), the fourth conductor layer (34B) and the via conductor (36C) are formed (FIG. 5A).

Figure 5B:
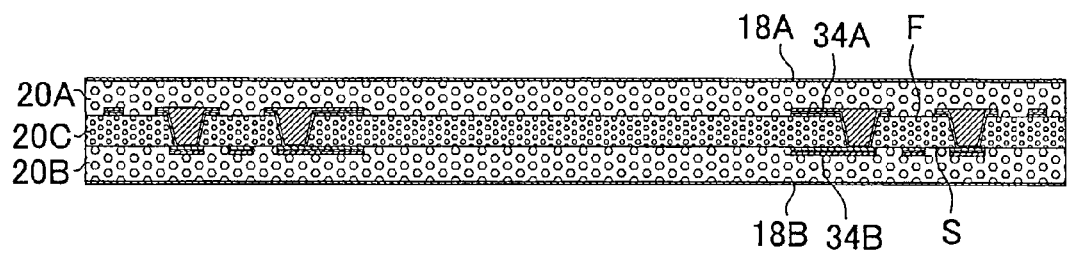

(7) A prepreg and a metal foil (18A) are superposed on the first surface (F) of the third resin layer (20C) and on the third conductor layer (34A). A prepreg and a metal foil (18B) are superposed on the second surface of the third resin layer (20C) and on the fourth conductor layer (34B). Thereafter, by hot pressing, the first resin layer (20A) and the second resin layer (20B) are formed from the prepregs (FIG. 5B). The first surface of the first resin layer and the second surface of the second resin layer are outermost layers of the core substrate.

Figure 5C:
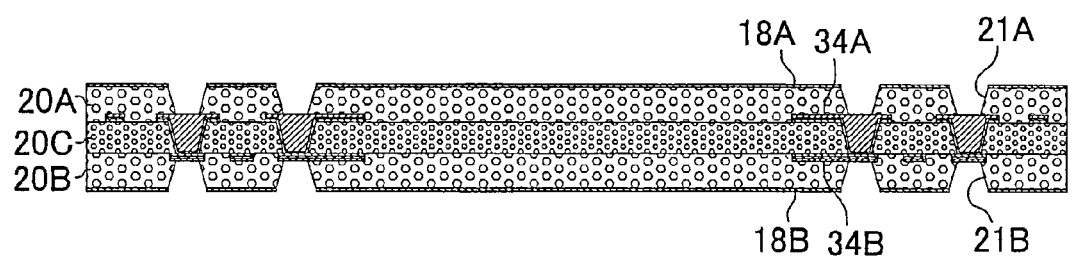

(8) An opening (21A) for a via conductor that reaches the third conductor layer (34A) on the third resin layer is formed using CO2 gas laser from the first surface side of the first resin layer (20A), and an opening (21B) for a via conductor that reaches the fourth conductor layer (34B) on the third resin layer is formed using CO2 gas laser from the second surface side of the second resin layer (20B) (FIG. 5C).

Figure 5D:
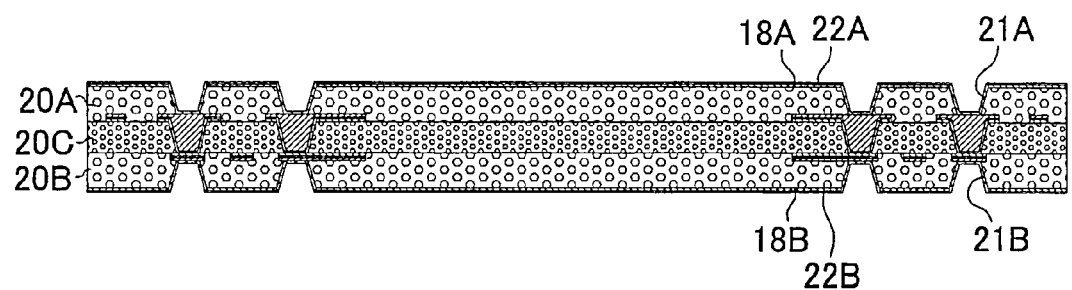

(9) By an electroless plating treatment, electroless plating films (22A, 22B) are formed on inner walls of the openings (21A, 21B) for the via conductors and on the metal foils (18A, 18B) (FIG. 5D).

Figure 6A:
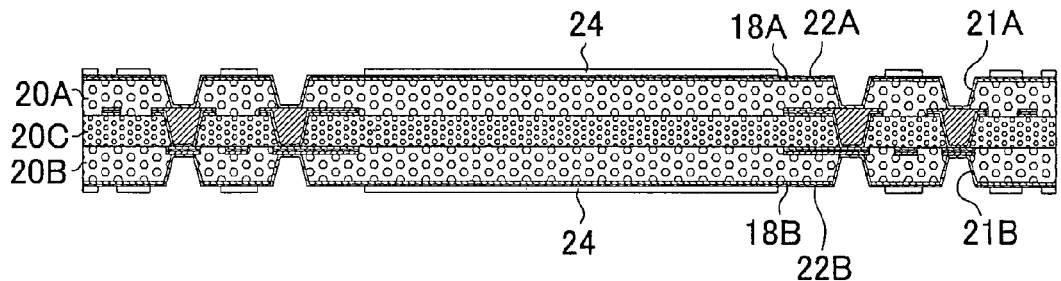
FIGS. 6A-6D are process diagrams illustrating the method for manufacturing the printed wiring board of the first embodiment.

(10) Plating resists 24 are respectively formed on the electroless plating films (22A, 22B) (FIG. 6A).

Figure 6B:
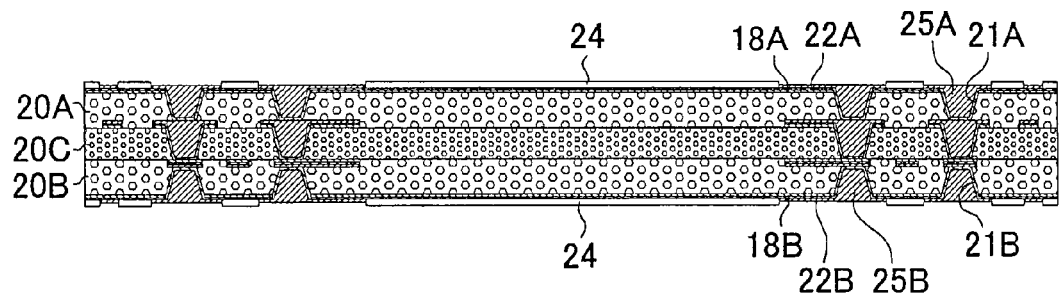

(11) Next, by an electrolytic plating treatment, electrolytic plating films (25A, 25B) are respectively formed on the electroless plating films (22A, 22B) that are respectively exposed from the plating resists 24 (see FIG. 6B).

Figure 6C:
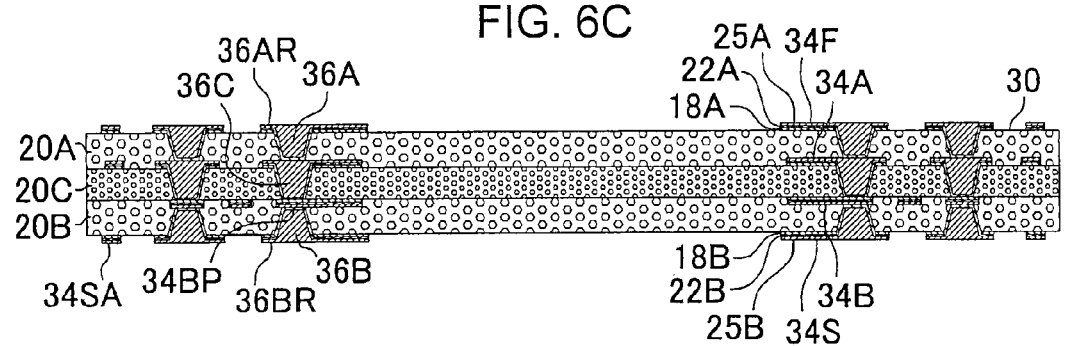

(12) Next, the plating resists are removed. Thereafter, the electroless plating films (22A, 22B) and the metal foils (18A, 18B) that are exposed from the electrolytic copper plating films (25A, 25B) are removed by etching, and the first conductor layer (34F) and the second conductor layer (34S) that are formed from the metal foils (18A, 18B), the electroless plating films (22A, 22B) and the electrolytic plating films (25A, 25B) are formed. At the same time, the via conductors (36A, 36B) are formed (FIG. 6C).

The second conductor layer (34S) includes an alignment mark (34SA). Further, the first conductor layer (34F) and the second conductor layer (34S) include conductor circuits and via conductor lands (36AR, 36BR).

Figure 6D:
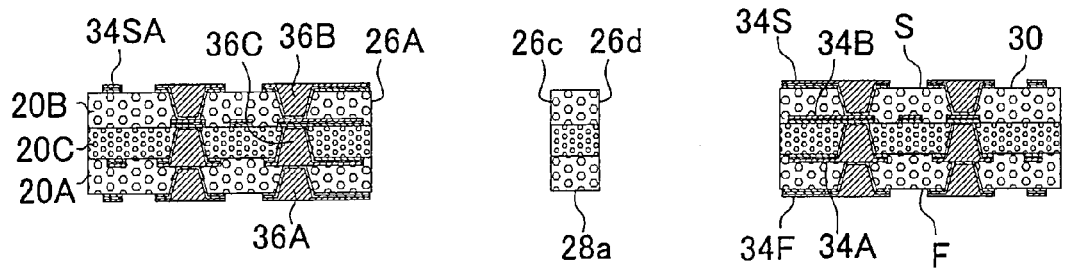

(13) The first cavity (26A) and the second cavity (26B) (see FIG. 2) that reach the first surface of the first resin layer (20A) from the second surface of the second resin layer (20B) are positioned using the alignment mark (34SA) in the second conductor layer as a reference and are formed using laser. The first cavity (26A) and the second cavity (26B) simultaneously penetrate through the first resin layer, the third resin layer and the second resin layer (FIG. 6D). The multilayer core substrate 30 having the resin layers is completed. The first cavity (26A) and the second cavity (26B) may also be tapered from the second surface toward the first surface.

Figure 7A:
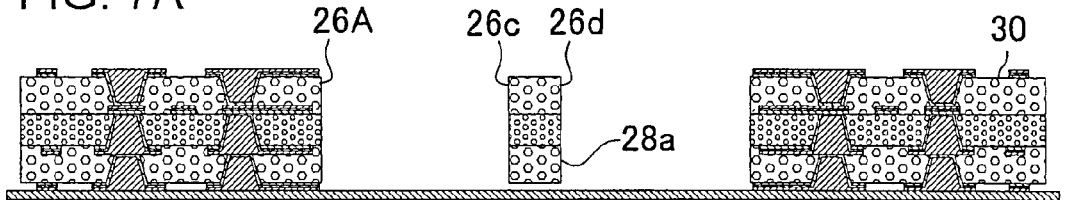
FIGS. 7A-7E are process diagrams illustrating the method for manufacturing the printed wiring board of the first embodiment.

(14) The multilayer core substrate 30 is reversed so that the second surface (S) faces upward and the first surface (F) faces downward. A tape 94 is affixed to the first surface of the multilayer core substrate 30. The first cavity (26A) and the second cavity (26B) are closed by the tape (FIG. 7A). An example of the tape 94 is a PET film.

Figure 7B:
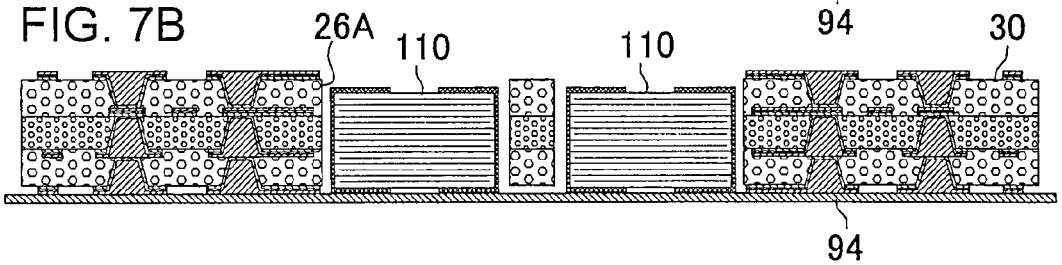

(15) On the tape 94 that is exposed by the first cavity (26A) and the second cavity (26B), the chip capacitors 110 are placed (FIG. 7B). The chip capacitors accommodated in the first cavity (26A) and the second cavity (26B) of the core substrate have thicknesses of 45%-100% of that of the core substrate.

Figure 7C:
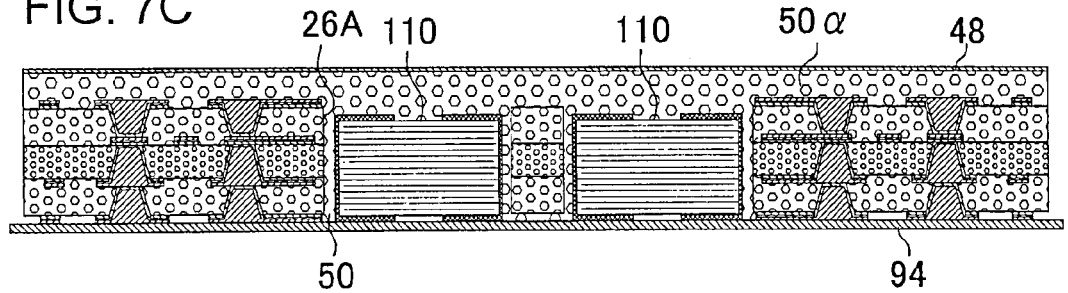

(16) A prepreg (50α) of a B-stage and a metal foil 48 are laminated on the second surface of the core substrate and on the electronic component. By hot pressing, resin seeps out from the prepreg into the first cavity (26A) and the second cavity (26B), and the first cavity (26A) and the second cavity (26B) are filled with a filler (resin filler) 50 (FIG. 7C). Spacings between inner walls of the first cavity (26A) and the second cavity (26B) and the chip capacitors are filled with the filler. The chip capacitor is fixed in the core substrate. Instead of the prepreg, it is also possible that a resin film for an interlayer insulating layer is laminated. The prepreg has a reinforcing material such as a glass cloth. However, the resin film for an interlayer resin layer does not have a reinforcing material. It is preferable that both the prepreg and the resin film contain inorganic particles such as glass particles. The filler contains inorganic particles such as silica.

Figure 7D:
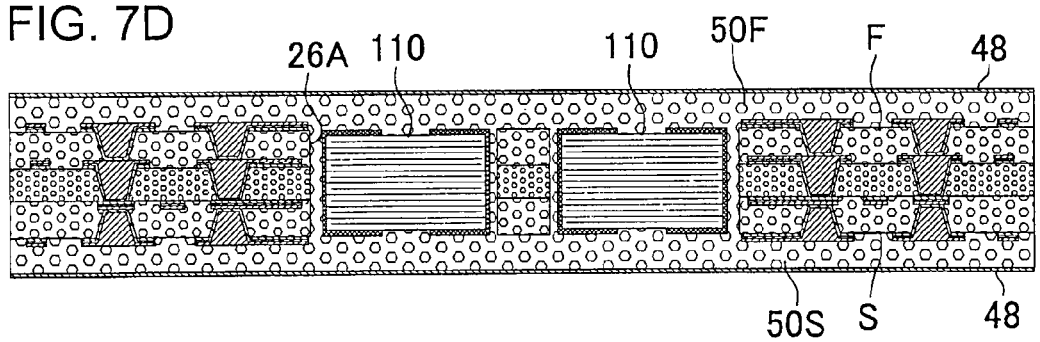
Figure 7E:
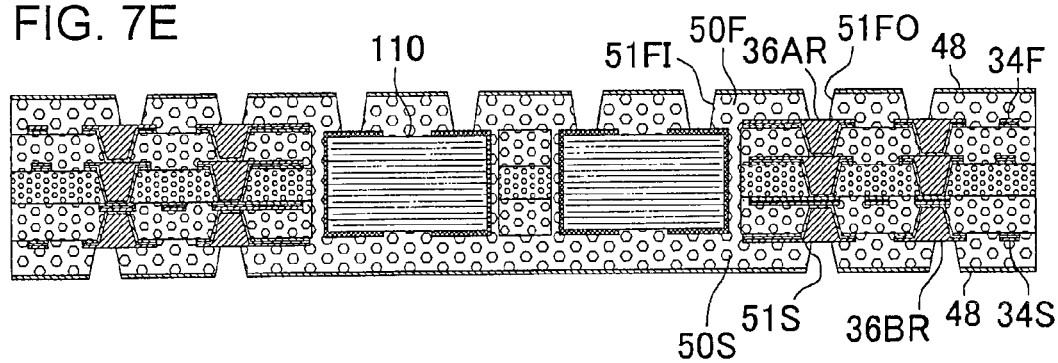

(17) After the tape is peeled off, the multilayer core substrate 30 is reversed so that the first surface (F) faces upward and the second surface (S) faces downward. A prepreg of a B-stage and a metal foil 48 are laminated on the first surface of the core substrate and on the electronic component. The prepregs that are laminated on both sides of the core substrate are heated and cured, and the interlayer resin insulating layers (50F, 50S) are formed (FIG. 7D). The interlayer resin insulating layer (50F) belongs to the upper side build-up layer, and the interlayer resin insulating layer (50S) belongs to the lower side build-up layer.

(18) An opening (51FO) for a via conductor that reaches the first conductor layer (34F) and the via land (36AR) of the first resin layer is formed in the interlayer resin insulating layer (50F). At the same time, an opening (51FI) for a via conductor that reaches the electrode 112 of the electronic component 110 is formed.

Figure 8A:
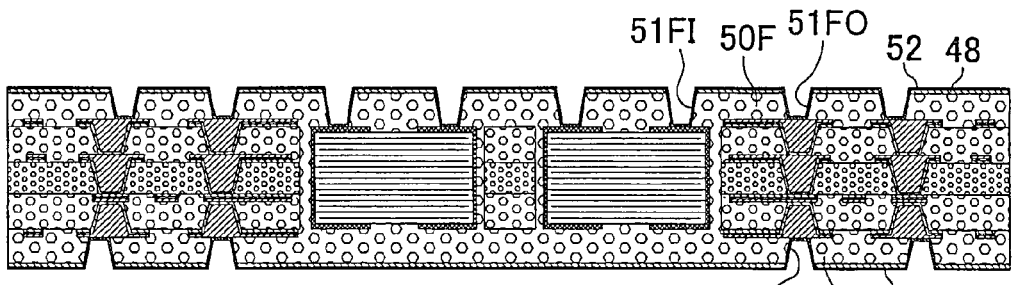
FIGS. 8A-8D are process diagrams illustrating the method for manufacturing the printed wiring board of the first embodiment.
Figure 8B:
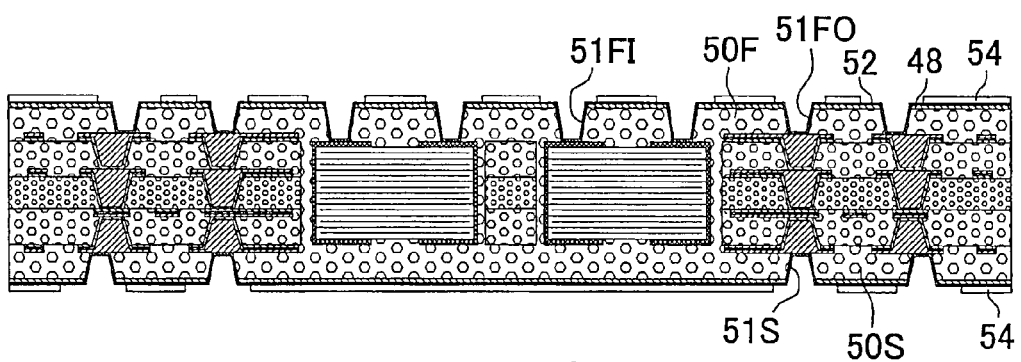
Figure 8C:
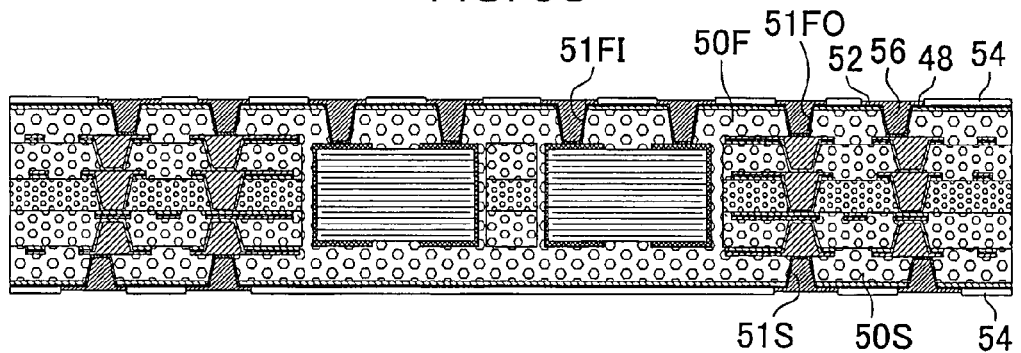
Figure 8D:
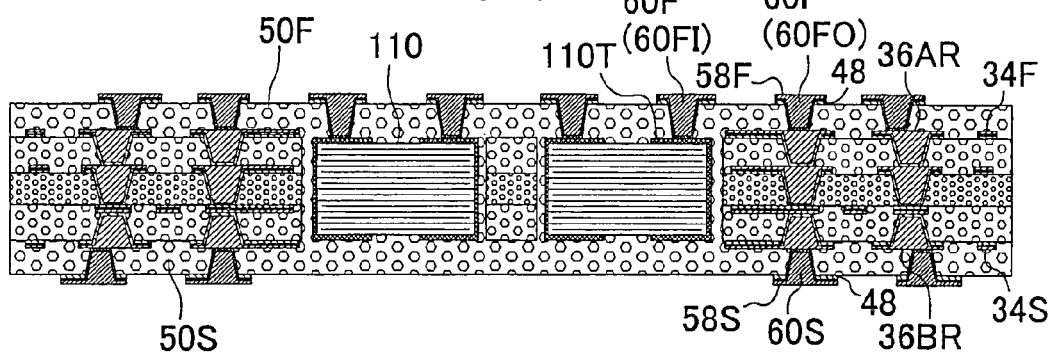

An opening (51S) for a via conductor that reaches the second conductor layer (34S) and the via land (36BR) of the second resin layer is formed in the interlayer resin insulating layer (50F). Electroless plating films 52 are formed on the metal foils (48, 48) and on inner walls of the openings (51FO, 51FI, 51S) (FIG. 8A). Thereafter, plating resists (54, 54) are formed on the electroless plating films (FIG. 8B). Next, electrolytic plating films (56, 56) are formed on the electroless plating films that are exposed from the plating resists (54, 54) (FIG. 8C). Then, the plating resists are removed, and the electroless plating films (52, 52) and the metal foils (48, 48) that are exposed from the electrolytic plating films are removed. The build-up layers are completed (FIG. 8D). The one-layer build-up layers are formed by the interlayer resin insulating layers (50F, 50S), the conductor layers (58F, 58S) on the interlayer resin insulating layers, and the via conductors (60FI, 60FO, 60S) that penetrate through the interlayer resin insulating layers. The via conductor (60FO) connects the first conductor layer (34F) and the via land (36AR) to the conductor layer (58F). The via conductor (60FI) connects the electrode 112 of the electronic component 110 to the conductor layer (58F). The via conductor (60S) connects the second conductor layer (34S) and the via land (36BR) to the conductor layer (58S). The build-up layer on the first surface of the core substrate is the upper side build-up layer, and the build-up layer on the second surface of the core substrate is the lower side build-up layer. The interlayer resin insulating layers (50F, 50S) each have a reinforcing material such as a glass cloth.

(19) Solder resist layers (70F, 70S) having openings 71 are formed on the upper side and lower side build-up layers. The openings 71 expose upper surfaces of the conductor layers and the via conductors. The exposed portions function as pads.

Figure 9A:
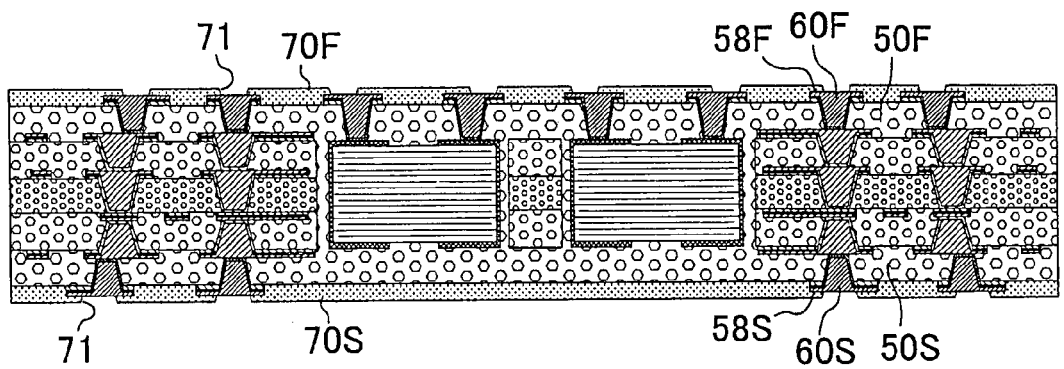
FIGS. 9A and 9B are process diagrams illustrating the method for manufacturing the printed wiring board of the first embodiment.
Figure 9B:
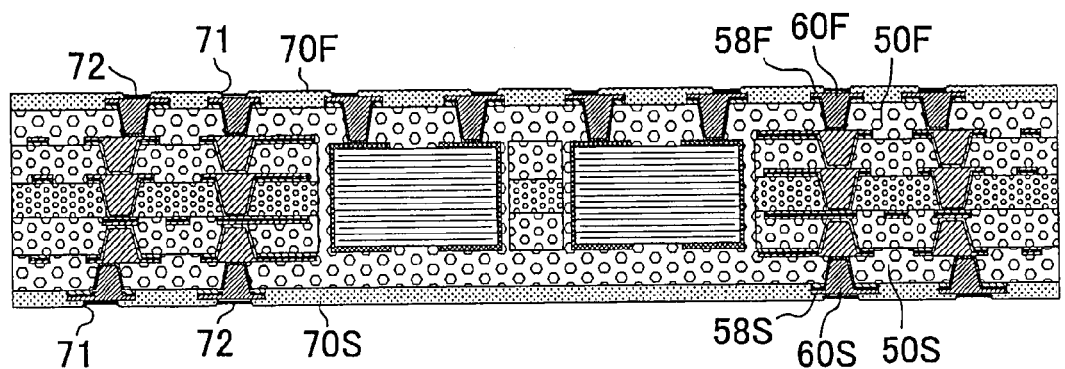

(20) On each of the pads, a metal film 72 is formed that includes a nickel layer and a gold layer on the nickel layer (FIG. 9B). Other than the nickel-gold layers, a metal film formed from nickel-palladium-gold layers may also be adopted. In the printed wiring board illustrated in FIG. 1, only the upper side build-up layer has a connection via conductor. The connection via conductor is a via conductor that connects to an electrode of an electronic component. Therefore, it is also possible that the lower side build-up layer does not have a conductor circuit on the lower side of the electronic component such as the chip capacitor. When the lower side build-up layer directly below the chip capacitor does not have a conductor circuit, warpage is likely to occur in the printed wiring board. In this case, it is preferable that the insulating layer of the upper side build-up layer have a thickness greater than that of the lower side build-up layer.

(21) Thereafter, the solder bump (76F) is formed on the pad of the upper side build-up layer and the solder bump (76S) is formed on the pad of the lower side build-up layer. The printed wiring board 10 having the solder bumps is completed (FIG. 1).

Via the solder bump (76F), an IC chip (not illustrated in the drawings) is mounted on the printed wiring board 10. Thereafter, via the solder bump (76S), the printed wiring board is mounted on a motherboard.

First Modified Example of First Embodiment

Figure 10A:
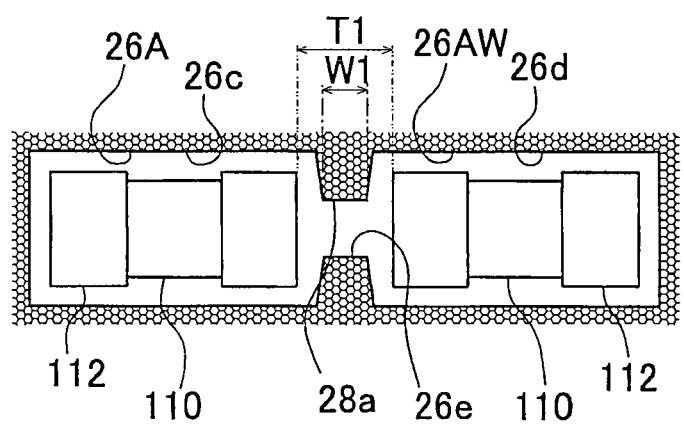
FIG. 10A illustrates a first cavity according to a first modified example of the first embodiment.
Figure 10B:
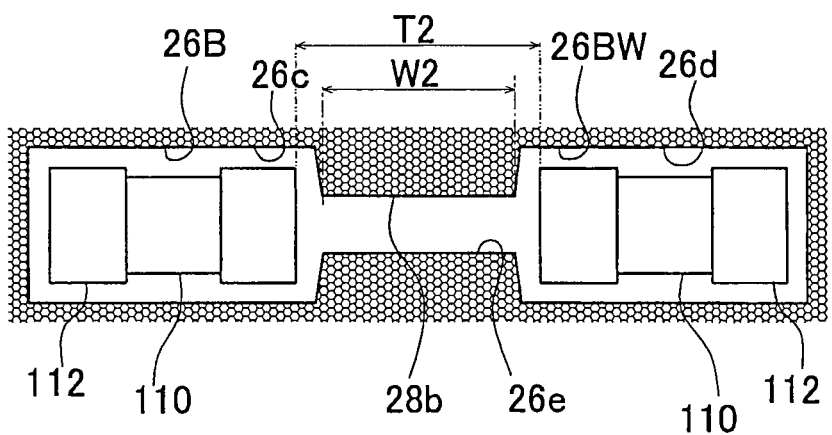
FIG. 10B illustrates a second cavity according to the first modified example of the first embodiment.

FIG. 10A illustrates a first cavity (26A) according to a first modified example of the first embodiment. FIG. 10B illustrates a second cavity (26B) according to the first modified example of the first embodiment.

The first cavity (26A) includes rectangular space part (26c) and space part (26d) for accommodating electronic components and first projections (28a), having trapezoidal horizontal cross sections, for partitioning between the electronic components in the space parts. The second cavity (26B) includes rectangular space part (26c) and space part (26d) for accommodating electronic components and second projections (28b), having trapezoidal horizontal cross sections, for partitioning between the electronic components in the space parts.

In the first modified example of the first embodiment, the space parts (26c, 26d) that accommodate the electronic components and the first projections (28a) and second projections (28b) that partition between the electronic components are formed in the coexisting first cavity (26A) and second cavity (26B), the first cavity (26A) having a relatively small width and the second cavity (26B) having a relatively large width. A distance (T1) between the electronic components in the first cavity, a width (W1) (a length of an upper base of the trapezoid) of the first projections (28a), a distance (T2) between the electronic components in the second cavity and a width (W2) (a length of an upper base of the trapezoid) of the second projection (28b) satisfy T1<T2 and W1<W2.

The projections (28a) that have a small width are provided in the first cavity (26A) that has a small width and the projections (28b) that have a large width are provided in the second cavity (26B) that has a large width. Therefore, the electronic components 110 can be respectively properly positioned by the coexisting first and second cavities, the first cavity having a small width and the second cavity having a large width.

Second Modified Example of First Embodiment

Figure 11A:
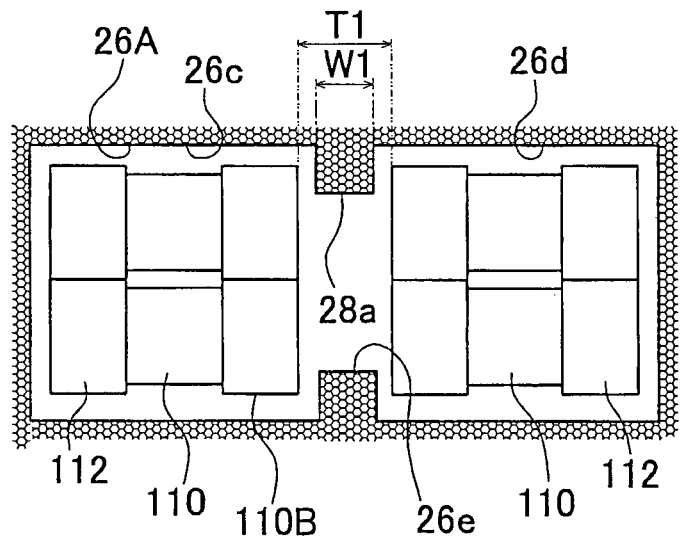
FIG. 11A illustrates a first cavity according to a second modified example of the first embodiment.
Figure 11B:
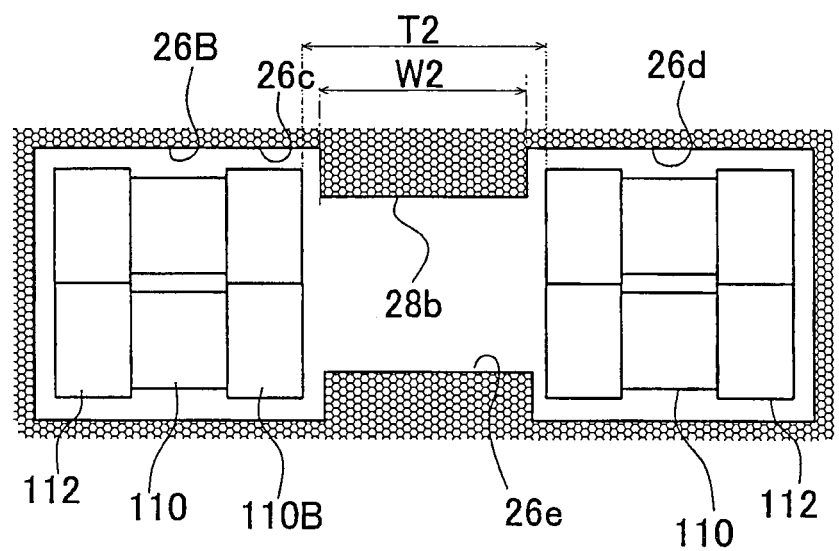
FIG. 11B illustrates a second cavity according to the second modified example of the first embodiment.

FIG. 11A illustrates a first cavity (26A) according to a second modified example of the first embodiment. FIG. 11B illustrates a second cavity (26B) according to the second modified example of the first embodiment.

In the second modified example of the first embodiment, electronic components (chip capacitors) (110), in each of which two chip capacitors are connected in parallel, are accommodated in the first cavity (26A) and the second cavity (26B).

In the second modified example of the first embodiment, the space parts (26c, 26d) that accommodate the electronic components and the first projections (28a) and second projections (28b) that partition between the electronic components are formed in the coexisting first cavity (26A) and second cavity (26B), the first cavity (26A) having a relatively small width and the second cavity (26B) having a relatively large width. A distance (T1) between the electronic components in the first cavity, a width (W1) of the first projections (28a), a distance (T2) between the electronic components in the second cavity and a width (W2) of the second projections (28b) satisfy T1<T2 and W1<W2.

The projections (28a) that have a small width are provided in the first cavity (26A) that has a small width and the projections (28b) that have a large width are provided in the second cavity (26B) that has a large width. Therefore, the electronic components 110 can be respectively properly positioned by the coexisting first and second cavities, the first cavity having a small width and the second cavity having a large width. In the second modified example of the first embodiment, an example is illustrated in which the chip capacitors are connected in parallel. However, in the structure of the embodiment, a case where chip capacitors are connected in series and a case where chip capacitors are connected in series and in parallel can also be similarly handled.

Third Modified Example of First Embodiment

Figure 12A:
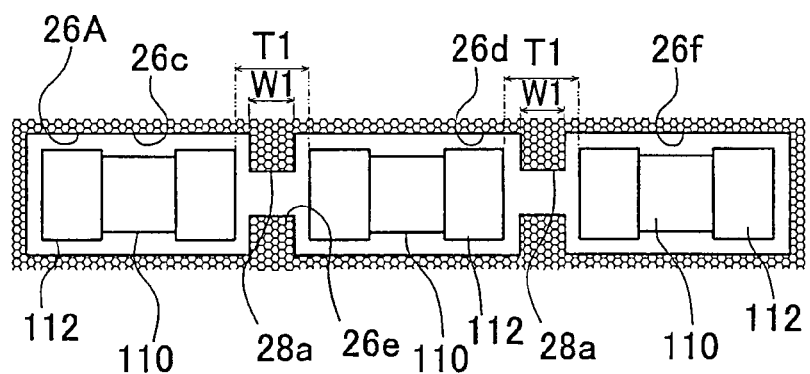
FIG. 12A illustrates a first cavity according to a third modified example of the first embodiment.
Figure 12B:
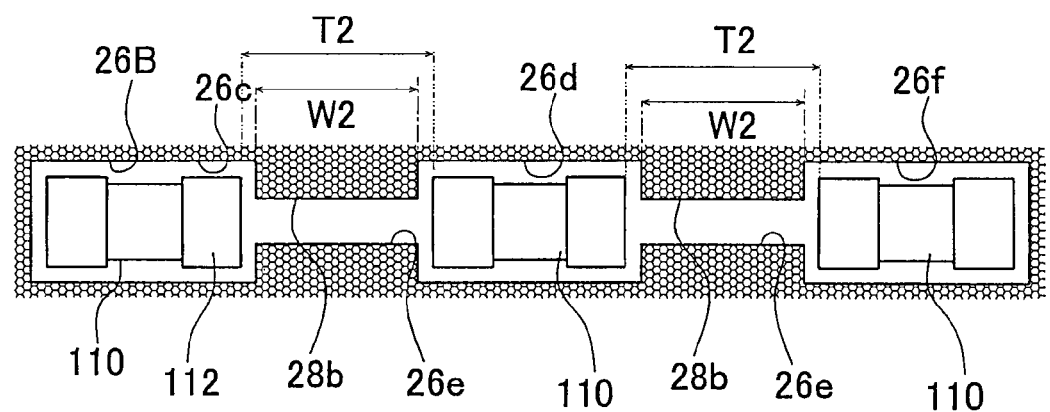
FIG. 12B illustrates a second cavity according to the third modified example of the first embodiment.

FIG. 12A illustrates a first cavity (26A) according to a third modified example of the first embodiment. FIG. 12B illustrates a second cavity (26B) according to the third modified example of the first embodiment.

The first cavity (26A) includes rectangular space part (26c), space part (26d) and space part (26f) for accommodating electronic components, rectangular first projections (28a) for partitioning between the electronic components in the space part (26c) and the space part (26d), and rectangular first projections (28a) for partitioning between the electronic components in the space part (26d) and the space part (26f).

The second cavity (26B) includes rectangular space part (26c), space part (26d) and space part (26f) for accommodating electronic components, rectangular second projections (28b) for partitioning between the electronic components in the space part (26c) and the space part (26d), and rectangular second projections (28b) for partitioning between the electronic components in the space part (26d) and the space part (26f).

In the third modified example of the first embodiment, the space parts (26c, 26d, 26f) that accommodate the electronic components and the first projections (28a) and second projections (28b) that partition between the electronic components are formed in the coexisting first cavity (26A) and second cavity (26B), the first cavity (26A) having a relatively small width and the second cavity (26B) having a relatively large width. A distance (T1) between the electronic components in the first cavity, a width (W1) of the first projections (28a), a distance (T2) between the electronic components in the second cavity and a width (W2) of the second projections (28b) satisfy T1<T2 and W1<W2.

The projections (28a) that have a small width are provided in the first cavity (26A) that has a small width and the projections (28b) that have a large width are provided in the second cavity (26B) that has a large width. Therefore, three or more of the electronic components 110 can be respectively properly positioned by the coexisting first and second cavities, the first cavity having a small width and the second cavity having a large width.

When multiple chip capacitors are accommodated in one opening, there is a problem that, when positioning accuracy of the chip capacitors in the opening is low, connection to the chip capacitor by via conductors may be not possible and connection reliability is reduced.

A printed wiring board with a built-in electronic component according to an embodiment of the present invention enhances reliability.

A printed wiring board according to an embodiment of the present invention includes: a core substrate that has a first cavity and a second cavity for accommodating an electronic component; multiple electronic components that are respectively accommodated in the first cavity and the second cavity; and a build-up layer that includes an insulating resin interlayer that is formed on the core substrate and covers the first cavity and the second cavity. Spaces that respectively accommodate the electronic components, and projections that partition between the electronic components are formed in the first cavity and the second cavity. A distance (T1) between the electronic components and a width (W1) of an edge of the projection in the first cavity, and a distance (T2) between the electronic components and a width (W2) of an edge of the projection in the second cavity, satisfy T1<T2 and W1<W2.

The projection that has a small width is provided in the first cavity that has a small width and the projection that has a large width is provided in the second cavity that has a large width. Therefore, the electronic components can be respectively properly positioned by the coexisting first and second cavities, the first cavity having a small width and the second cavity having a large width. Further, even when the cavities having different widths coexist, it does not cause a contact failure or the like to occur between the electronic components. Therefore, flexibility in designing the sizes of the cavities is increased.

Obviously, numerous modifications and variations of the present invention are possible in light of the above teachings. It is therefore to be understood that within the scope of the appended claims, the invention may be practiced otherwise than as specifically described herein.

What is claimed is:
1. A printed wiring board, comprising:
a core substrate having a first cavity and a second cavity;
a plurality of first electronic components accommodated in the first cavity of the core substrate;
a plurality of second electronic components accommodated in the second cavity of the core substrate; and a build-up layer formed on the core substrate and comprising an insulating resin interlayer such that the insulating resin interlayer is covering the first cavity and the second cavity, wherein the core substrate has a first projection structure partitioning the first electronic components in the first cavity and a second projection structure partitioning the second electronic components in the second cavity, and the first and second cavities and the first and second projection structures are formed in the core substrate such that T1<T2 and W1<W2 are satisfied where T1 represents a distance between the first electronic components, T2 represents a distance between the second electronic components, W1 represents a width of an edge of the first projection structure in the first cavity, and W2 represents a width of an edge of the second projection structure in the second cavity.

2. A printed wiring board according to claim 1, wherein the core substrate is a multilayer core substrate comprising a plurality of resin layers.

3. A printed wiring board according to claim 2, wherein the multilayer core substrate comprises a stacked via structure comprising a plurality of via conductors formed in the plurality of resin layers, respectively.

4. A printed wiring board according to claim 1, wherein the core substrate comprises a filler comprising resin and filling the first and second cavities such that the first electronic components and second electronic components are fixed in the first and second cavities, respectively.

5. A printed wiring board according to claim 1, wherein the first projection structure comprises a pair of projections each having a rectangular shape, and the second projection structure comprises a pair of projections each having a rectangular shape.

6. A printed wiring board according to claim 1, wherein the first projection structure comprises a pair of projections each having a trapezoid shape, and the second projection structure comprises a pair of projections each having a trapezoid shape.

7. A printed wiring board according to claim 1, wherein each of the first electronic components is a chip capacitor, and each of the second electronic components is a chip capacitor.

8. A printed wiring board according to claim 1, wherein the build-up layer comprises a conductor layer formed on the insulating resin interlayer and a plurality of via conductors formed through the insulating resin interlayer such that the plurality of via conductors is connecting the conductor layer and the first and second electronic components in the first and second cavities.

9. A printed wiring board according to claim 2, wherein the multilayer core substrate comprises a filler comprising resin and filling the first and second cavities such that the first electronic components and second electronic components are fixed in the first and second cavities, respectively.

10. A printed wiring board according to claim 2, wherein the first projection structure comprises a pair of projections each having a rectangular shape, and the second projection structure comprises a pair of projections each having a rectangular shape.

11. A printed wiring board according to claim 2, wherein the first projection structure comprises a pair of projections each having a trapezoid shape, and the second projection structure comprises a pair of projections each having a trapezoid shape.

12. A printed wiring board according to claim 2, wherein each of the first electronic components is a chip capacitor, and each of the second electronic components is a chip capacitor.

13. A printed wiring board according to claim 2, wherein the build-up layer comprises a conductor layer formed on the insulating resin interlayer and a plurality of via conductors formed through the insulating resin interlayer such that the plurality of via conductors is connecting the conductor layer and the first and second electronic components in the first and second cavities.

14. A printed wiring board according to claim 1, wherein the build-up layer comprises a conductor layer formed on the insulating resin interlayer and a plurality of via conductors formed through the insulating resin interlayer such that the plurality of via conductors is connecting the conductor layer and the first and second electronic components in the first and second cavities, and the conductor layer formed on the insulating resin interlayer includes a plurality of pads positioned to mount an IC chip on the build-up layer.

15. A printed wiring board according to claim 1, further comprising:
a second build-up layer formed on the core substrate and comprising an insulating resin interlayer such that the insulating resin interlayer is covering the first cavity and the second cavity on an opposite side of the core substrate with respect to the build-up layer.

16. A printed wiring board according to claim 1, further comprising:
a second build-up layer formed on the core substrate and comprising an insulating resin interlayer such that the insulating resin interlayer is covering the first cavity and the second cavity on an opposite side of the core substrate with respect to the build-up layer,
wherein the build-up layer comprises a conductor layer formed on the insulating resin interlayer and a plurality of via conductors formed through the insulating resin interlayer such that the plurality of via conductors is connecting the conductor layer and the first and second electronic components in the first and second cavities, and the conductor layer formed on the insulating resin interlayer includes a plurality of pads positioned to mount an IC chip on the build-up layer.

17. A printed wiring board according to claim 1, further comprising:
a second build-up layer formed on the core substrate and comprising an insulating resin interlayer such that the insulating resin interlayer is covering the first cavity and the second cavity on an opposite side of the core substrate with respect to the build-up layer,
wherein the build-up layer comprises a conductor layer formed on the insulating resin interlayer and a plurality of via conductors formed through the insulating resin interlayer such that the plurality of via conductors is connecting the conductor layer and the first and second electronic components in the first and second cavities, the conductor layer formed on the insulating resin interlayer in the build-up layer includes a plurality of pads positioned to mount an IC chip on the build-up layer, the second build-up layer comprises a conductor layer formed on the insulating resin interlayer such that the conductor layer formed on the insulating resin interlayer in the second build-up layer includes a plurality of pads positioned to mount a mother board on the second build-up layer.

18. A printed wiring board according to claim 15, wherein the core substrate is a multilayer core substrate comprising a plurality of resin layers.

19. A printed wiring board according to claim 16, wherein the core substrate is a multilayer core substrate comprising a plurality of resin layers.

20. A printed wiring board according to claim 17, wherein the core substrate is a multilayer core substrate comprising a plurality of resin layers.

* * * * *